(12) United States Patent
Disegni et al.

(10) Patent No.: US 12,260,910 B2
(45) Date of Patent: Mar. 25, 2025

(54) SENSE AMPLIFIER ARCHITECTURE FOR A NON-VOLATILE MEMORY STORING CODED INFORMATION

(71) Applicant: STMICROELECTRONICS S.r.l., Agrate Brianza (IT)

(72) Inventors: Fabio Enrico Carlo Disegni, Spino d'adda (IT); Marcella Carissimi, Treviolo (IT); Alessandro Tomasoni, Sotto il Monte Giovanni XXIII (IT); Daniele Lo Iacono, Bergamo (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 180 days.

(21) Appl. No.: 18/148,380

(22) Filed: Dec. 29, 2022

(65) Prior Publication Data
US 2023/0245699 A1 Aug. 3, 2023

(30) Foreign Application Priority Data
Jan. 7, 2022 (IT) .......................... 102022000000179

(51) Int. Cl.
*G11C 13/00* (2006.01)
(52) U.S. Cl.
CPC ........ *G11C 13/004* (2013.01); *G11C 13/0004* (2013.01); *G11C 2013/0045* (2013.01); *G11C 2013/0054* (2013.01)
(58) Field of Classification Search
CPC .............. G11C 13/004; G11C 13/0004; G11C 2013/0045; G11C 2013/0054; G11C 7/062
See application file for complete search history.

(56) References Cited

U.S. PATENT DOCUMENTS

| | | | |
|---|---|---|---|
| 8,988,946 B1 * | 3/2015 | D'Abreu | G11C 13/0028 365/185.23 |
| 9,349,490 B2 | 5/2016 | Carissimi et al. | |
| 9,619,328 B2 | 4/2017 | Mittelholzer et al. | |
| 10,319,438 B2 | 6/2019 | Calvetti et al. | |

(Continued)

FOREIGN PATENT DOCUMENTS

WO 2021135839 A1 7/2021

*Primary Examiner* — Mohammed A Bashar
(74) *Attorney, Agent, or Firm* — Seed IP Law Group LLP

(57) ABSTRACT

The present disclosure is directed to a sense amplifier architecture for a memory device having a plurality of memory cells. Groups of non-volatile memory cells store respective codewords formed by stored logic states, logic high or logic low, of the memory cells of the group. The sense amplifier architecture has a plurality of sense amplifier reading branches, each sense amplifier reading branch coupled to a respective memory cell and configured to provide an output signal, which is indicative of a cell current flowing through the same memory cell; a comparison stage, to perform a comparison between the cell currents of memory cells of a group; and a logic stage, to determine, based on comparison results provided by the comparison stage, a read codeword corresponding to the group of memory cells. Information may be stored in different subsets of codewords, the sense amplifier architecture in this case having a subset definition circuit, to allow a preliminary determination of the subset to which a codeword to be read belongs to, based on reference signals.

20 Claims, 8 Drawing Sheets

(56) References Cited

U.S. PATENT DOCUMENTS

| | | |
|---|---|---|
| 11,133,064 B2 | 9/2021 | Carissimi et al. |
| 2003/0035324 A1* | 2/2003 | Fujita .................. G11C 7/06 |
| | | 365/189.07 |
| 2009/0067218 A1* | 3/2009 | Graber ............. G11C 11/4091 |
| | | 365/207 |
| 2010/0085799 A1* | 4/2010 | Cho .................. G11C 13/004 |
| | | 365/207 |
| 2016/0179619 A1 | 6/2016 | Mittelholzer et al. |
| 2019/0215014 A1 | 7/2019 | Qin |

* cited by examiner

SENSE AMPLIFIER ARCHITECTURE FOR A NON-VOLATILE MEMORY STORING CODED INFORMATION

BACKGROUND

Technical Field

The present disclosure relates to a sense amplifier architecture for a non-volatile memory.

Description of the Related Art

In non-volatile memories, such as PCM (Phase Change Memory), ST-RAM (Magneto Resistive Random Access Memory), RRAM (Resistive Random Access Memory), the stored information is associated to different physical states of the memory cells; such states can be inferred/changed by operating on the current flowing through the memory cells.

In particular, in PCM memories the characteristics of materials having the property of switching between phases with a different electrical behavior are exploited for storing information. These materials can switch between a disorderly/amorphous phase and an orderly crystalline or polycrystalline phase; different phases are characterized by different values of resistivity and are consequently associated with different values of a datum stored. For instance, the elements of Group VI of the periodic table, such as tellurium (Te), selenium (Se) or antimony (Sb), also known as chalcogenides or chalcogenic materials, can be used for manufacturing phase-change memory cells; in particular, an alloy formed by germanium (Ge), antimonium (Sb), and tellurium (Te), known as GST (having the chemical composition $Ge_2Sb_2Te_5$), is currently widely used in such memory cells.

Phase changes can be obtained by locally increasing the temperature of the cells of chalcogenic material, through resistive electrodes (known in general as heaters) set in contact with corresponding regions of chalcogenic material.

Access (or selection) devices, (for example bipolar or MOS transistors), are connected to the heaters and selectively enable the passage of a programming electric current (also known as write electric current); this electric current, by the Joule effect, generates the temperature for phase change, and in particular for switching from a high-resistivity state (known as RESET state) to a low-resistivity state (the so-called SET state) or vice versa.

During reading, the state of the chalcogenic material is detected by applying a voltage that is sufficiently low so as not to cause a sensitive heating thereof, and then reading the value of the current flowing in the memory cell through a sense amplifier circuit. Since the current is proportional to the conductivity of the chalcogenic material, it is possible to determine the state of the same chalcogenic material and consequently determine the information stored in the memory cell.

FIG. 1 schematically shows a non-volatile storage device 1, comprising a memory array 2 formed by a plurality of memory cells 3, arranged in rows, or wordlines WL, and columns, or bitlines, the latter also being known as local bitlines LBL.

Each memory cell 3 is formed by a storage element 3a and by an access element 3b, which are series-connected between a respective local bitline LBL and a reference terminal at a reference potential (for example ground, GND). A wordline WL is defined by the set of all the control terminals of access elements 3b aligned along a same row.

In a manner not shown, main bitlines MBL are provided for each set of a number of local bitlines LBL, allowing to access the respective set of local bitlines (and corresponding memory cells) for reading and writing operations.

The storage element 3a includes a phase-change material element (for example, a chalcogenide, such as GST) and is consequently able to store data in the form of levels of resistance associated with the various phases assumed by the same material.

The access element 3b is, for example, an N-channel MOS transistor having its gate terminal connected to a respective wordline WL, its drain terminal connected to a first terminal of the storage element 3a, and its source terminal connected to the reference potential; a second terminal of the storage element 3a is connected to a corresponding local bitline LBL. The access element 3b is controlled and biased so as to enable, when selected, the passage of a writing current or of a reading current (denoted, in general, as 'cell current'), through the storage element 3a.

A column decoder 4 and a row decoder 5 enable selection of the memory cells 3, on the basis of address signals received, at an input (designated as a whole by AS) and suitable decoding schemes. The address signals AS can be generated by a control logic CL, which moreover controls the column decoder 4 and the row decoder 5 so as to enable reading and writing (during so called 'SET' and 'RESET' operations) of the memory cells 3 addressed by the address signals AS. Albeit not illustrated herein, the control logic CL also supplies control signals to the column decoder 4 and to the row decoder 5, in order to control the aforementioned reading/writing operations.

In particular, the column decoder 4 and the row decoder 5 enable selection of the wordlines WL and of the local bitlines LBL addressed, and therefore enable biasing at appropriate voltage values of the wordlines WL and local bitlines LBL selected, according to a hierarchical decoding scheme (involving also selection of the corresponding main bit lines).

The column decoder 4 is furthermore configured to internally implement two distinct paths towards the local bitlines LBL of the memory array 2 each time selected: a reading path, designed to selectively create a conductive path between each selected local bitline LBL and a read block 7, which includes a plurality of sense amplifiers; and a writing path, designed to selectively create a conductive path between each selected local bitline LBL and a write block 8 configured to supply the currents for the writing operations, i.e., for the so-called programming of the memory cells in corresponding logic states, and therefore for storage of information.

The column decoder 4 comprises, for each reading and programming path, appropriate selection elements (in particular, controlled transistors), connected so as to implement an address-decoding system, which is typically hierarchical, for selection of the memory cells 3.

In a known manner, non-volatile memories may have a differential architecture, where data (logic bits) are stored in two memory cells, a direct and a complementary cell, having opposite states (for example, a direct cell having a high, '1,' logic value and the corresponding complementary cell having a low, '0,' logic value, i.e., a negated value with respect to the direct cell).

This differential encoding, i.e., storing not only the actual direct value (one or zero), but also its negated or complementary value (zero or one) in a pair of memory cells, allows to avoid problems due to drifting of the stored values during the life of the memory cells.

In the differential architecture, reading operations consist in comparing the difference of current in two branches of a respective sense amplifier (e.g., in the above discussed read block 7), coupled to the direct and, respectively, the complementary cells, the output of the sense amplifier being indicative of the stored information (logic bit). Since the logic bit is associated with a current difference, its value can be read correctly even if the physical values of the direct and complementary cells have drifted in time.

The drawback of the differential architecture is the doubled number of memory cells used to store a same amount of information or, equivalently, the halved number of information bits that can be stored using a same number of memory cells.

For example, in case the word size of the stored data is 32 bit, considering also additional bits for error correction codes (e.g., 6 bit SEC, Single Error Correction, +1 bit DED, Double Error Detection), 78 memory cells are used for a differential architecture.

Likewise, for a word size of 64 information bit+14 bit DEC+1 bit TED, 158 memory cells are used for differential encoding.

In general, the efficiency of a differential memory array (e.g., of the PCM type) does not exceed 50%.

Due to the fact that area density is a key enabler, there is a desire to provide an improved solution for storing information in non-volatile memories of a differential type and to provide a corresponding improved sense amplifier architecture able to read the stored information.

BRIEF SUMMARY

Various embodiments of the present disclosure provide a sense amplifier architecture that will satisfy, at least in part, the above desires noted by the present Applicant.

The sense amplifier architecture is for a non-volatile memory, where information are stored in a coded manner. In particular, embodiments of the present disclosure will refer to non-volatile memories where stored information are associated with a current flowing through corresponding memory cells; more in particular, embodiments of the present disclosure will refer to Phase Change Memories (PCM).

According to one embodiment, a sense amplifier architecture is for a memory device having a plurality of memory cells. Groups of non-volatile memory cells store respective codewords formed by stored logic states, logic high or logic low, of the memory cells of the group. The sense amplifier architecture includes a plurality of sense amplifier reading branches, where each sense amplifier reading branch is coupled to a respective memory cell and is configured to provide an output signal, which is indicative of a cell current flowing through the same memory cell. The sense amplifier architecture also includes a comparison stage, to perform a comparison between the cell currents of memory cells of a group; and a logic stage, to determine, based on comparison results provided by the comparison stage, a read codeword corresponding to the group of memory cells. Information may be stored in different subsets of codewords. The sense amplifier architecture in this case having a subset definition circuit, to allow a preliminary determination of the subset to which a codeword to be read belongs to, based on reference signals

BRIEF DESCRIPTION OF THE SEVERAL VIEWS OF THE DRAWINGS

For a better understanding of the present disclosure, embodiments thereof will now be described, purely by way of example non-limiting example, with reference to the attached drawings, wherein.

DETAILED DESCRIPTION

The present Applicant has realized that a more compact and efficient memory occupation, while maintaining the advantages of a differential memory architecture, can be achieved by storing information in the non-volatile memory cells in a coded manner.

In particular, a group of a determined number (greater than two) of non-volatile memory cells may store a codeword formed by the values of stored states of the cells of the group, taken according to a given order; the memory cells being of the type in which a stored logic state, which can be logic high ('1') or logic low ('0'), can be changed through application of a current and the state in the memory cell is read by reading a current flowing through the same memory cell.

For instance, in case the group of non-volatile memory cells includes a number $N_c$ of memory cells equal to four, a first exemplary stored codeword may correspond to a combination of states [0 0 1 0], i.e., where a first, a second and a fourth cells have a '0' logic value (also referred to as 'RESET' state, in case of a PCM memory cell) and a third cell has a '1' logic value (also referred to as 'SET' state, in case of a PCM memory cell); while a second exemplary codeword may correspond to a combination of states [0 0 0 1]. To each codeword, a symbol may correspond, i.e., a value or data label to which the codeword is mapped (for example, the symbols '2' or '3' for the first and second exemplary codewords).

A reading (sense amplifier) circuit, configured to implement a decoding of the information stored in the coded manner, may for example be configured to identify the position and/or the number of the "ones" in the group of memory cells. This can be obtained by comparing, between each other (e.g., with pairwise comparisons), the currents of the memory cells in the group of cells.

Figure 1:
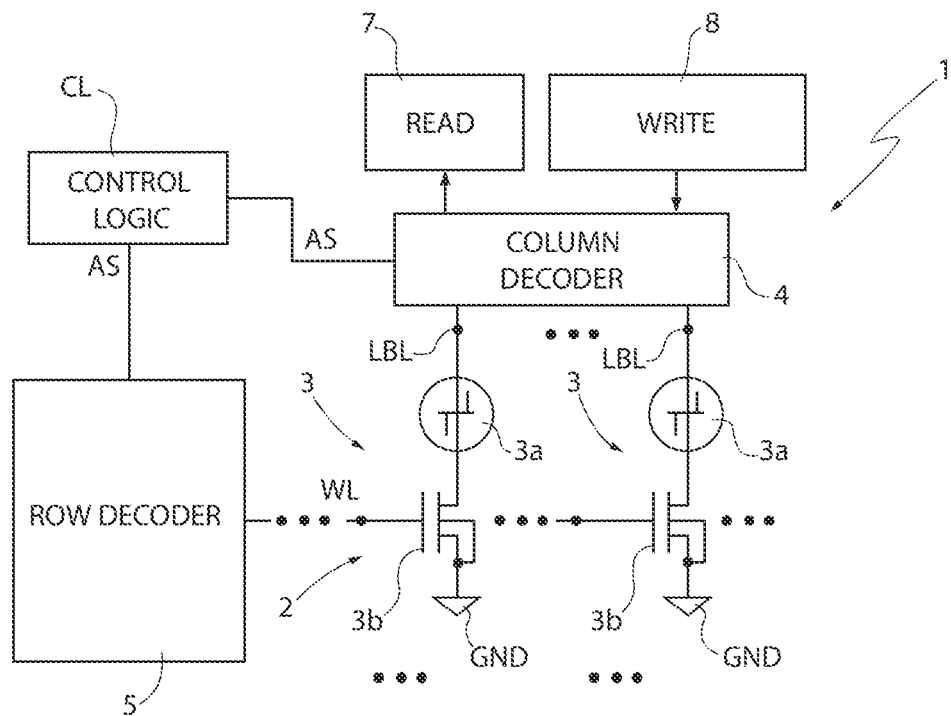
FIG. 1 shows a schematic and general block diagram of a non-volatile memory device, in particular of the PCM type.

One aspect of the present solution therefore provides a sense amplifier architecture, which, by way of example, can be implemented in the read block 7 of a non-volatile storage device 1 such as the one illustrated in FIG. 1, that is configured to allow reading of the information stored, in a coded manner, in the non-volatile memory cells, implementing, in particular, comparisons between cell currents of different memory cells.

Figure 2:
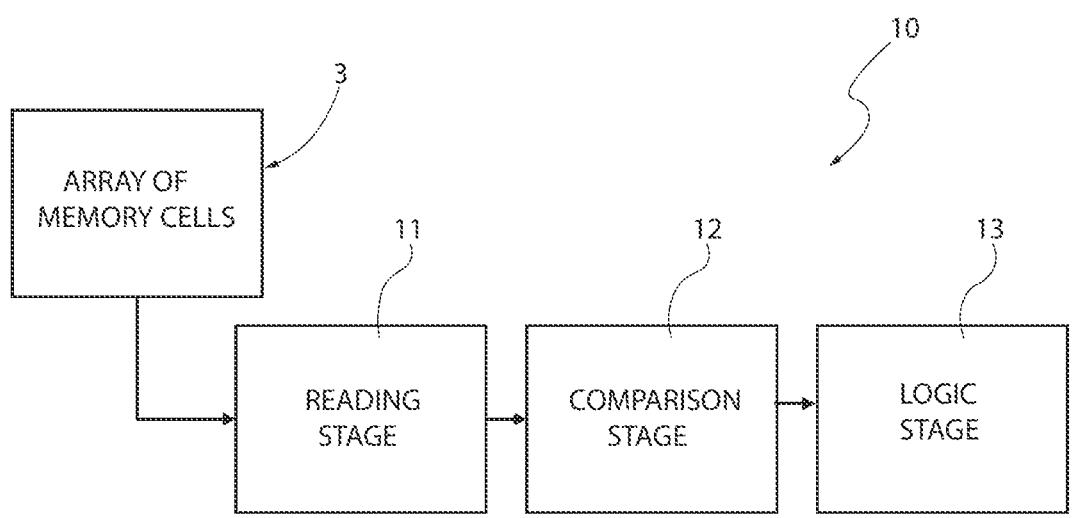
FIG. 2 shows a schematic block diagram of a sense amplifier architecture according to an embodiment of the present solution.

As shown in FIG. 2, the sense amplifier architecture, denoted in general with 10, comprises: a reading stage 11, coupled to the array of memory cells 3 of a non-volatile storage device 1 (e.g., of the PCM type), and including a plurality of sense amplifier reading branches, one for each memory cell 3, configured to read the respective cell current $I_{cell}$; a comparison stage 12, which is configured to perform a comparison of the cell currents of different memory cells 3 of a group, for example by comparing them pairwise obtaining respective pairwise comparison results, i.e., binary values, in particular bits, which are zeros or ones depending on which current of the two memory cells being compared is greater; and a logic stage 13, configured to determine, based on the comparison results provided by the comparison stage 12, a read codeword corresponding to the group of memory cells 3 and a corresponding decoded symbol. As will be discussed in further detail below, each of the reading stage 11, the comparison stage 12, and the logic stage 13 may be implemented in circuitry.

Figure 3:
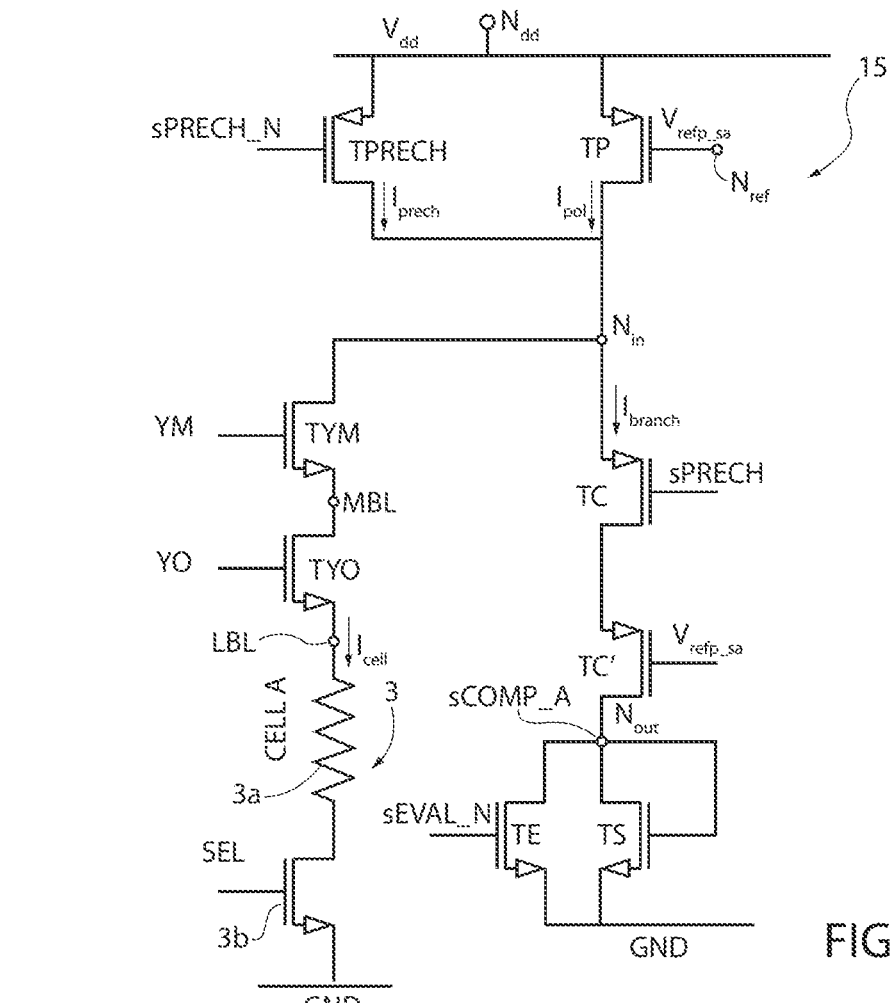
FIG. 3 shows a circuit diagram of a sense amplifier reading circuit of the sense amplifier architecture.

In more details, FIG. 3 shows a sense amplifier reading branch, denoted with 15, of the reading stage 11 of the sense amplifier architecture 10.

As previously discussed, the sense amplifier reading branch 15 is coupled to a respective memory cell 3 (here denoted as Cell_A), for example a PCM cell formed by a storage element 3a (represented as a resistive element) and by an access element 3b (in the example an NMOS transistor, having a gate terminal receiving a selection and biasing signal SEL, e.g., from the row decoder 5 of FIG. 1); the sense amplifier reading branch 15 is configured to provide an output signal sCOMP_A, which is indicative of the cell current $I_{cell}$ flowing through the same memory cell 3, in particular being related by an inverse relation to the same cell current $I_{cell}$.

In detail, the sense amplifier reading branch 15 comprises a bias transistor TP and a precharge transistor TPRECH, which are P-channel enhancement-mode transistors and have, for example, similar characteristics.

The source terminals of the bias transistor TP and of the precharge transistor TPRECH are connected to a supply node $N_{dd}$, which is set at a supply voltage $V_{dd}$, for example, equal to 1 Volt. The gate terminal of the bias transistor TP is connected to a reference node $N_{ref}$, which is set at a reference voltage $V_{refp\_sa}$; a signal sPRECH_N is provided to the gate terminal of the precharge transistor TPRECH (this signal sPRECH and the corresponding negation sPRECH_N can be generated for example by the control logic CL, see FIG. 1, and can vary between 0 V and the supply voltage $V_{dd}$). Moreover, the drain terminals of the same bias transistor TP and precharge transistor TPRECH are connected to one another and define an input node $N_{in}$.

The sense amplifier reading branch 15 further comprises an upper control transistor TC and a lower control transistor TC', which are P-channel enhancement-mode transistors and have, for example, similar characteristics.

The upper control transistor TC and the lower control transistor TC' are connected together in series. In particular, the source terminal of the upper control transistor TC is connected to the input node $N_{in}$, whereas the drain terminal of the upper control transistor TC is connected to the source terminal of the lower control transistor TC', the drain terminal of which forms an output node $N_{out}$, on which the output signal sCOMP_A is provided. A signal sPRECH is present on the gate terminal of the upper control transistor TC, which is equal to the logical negation of the above signal sPRECH_N; the aforementioned reference voltage $V_{refp\_sa}$ (or a different reference voltage with a fixed value) is present on the gate terminal of the lower control transistors TC'.

The sense amplifier reading branch 15 further comprises a sense transistor TS and an evaluation transistor TE, which are of the N-channel enhancement-mode type, have similar characteristics and have their source terminals connected to a reference potential, e.g., to ground GND.

The drain terminals of the sense transistor TS and of the evaluation transistor TE are connected to the output node $N_{out}$; the gate terminal of the sense transistor TS is connected to the same output node $N_{out}$, the same sense transistor TS being therefore diode-connected. Moreover, a signal sEVAL_N is present on the gate terminal of the evaluation transistor TE (the signal sEVAL_N and the corresponding negation sEVAL can also be generated by the control logic CL and may vary between 0 V and the supply voltage $V_{dd}$).

The input node $N_{in}$ is coupled to the memory cell 3 through a first-level decoding transistor TYO and a second-level decoding transistor TYM, which are N-channel enhancement-mode transistors, have, for example, similar characteristics and are connected together in series.

In particular, the drain terminal of the second-level decoding transistor TYM is connected to the input node $N_{in}$, whereas the source terminal of the second-level decoding transistor TYM is connected to the drain terminal of the first-level decoding transistor TYO, which is coupled to a main bitline MBL. The source terminal of the first-level transistor TYO is coupled to a local bitline LBL and therefore also to the storage element 3a of the first memory cell 3. Corresponding first-level decoding and second-level decoding bias signals, designated by YO and YM and generated, for example, by the column decoder 4 (see FIG. 1), are provided to the gate terminals of the first-level transistor TYO and, respectively, of the second-level transistor TYM (in a known manner, to select and bias the corresponding local bit line at a desired voltage for the memory operations).

Figure 4:
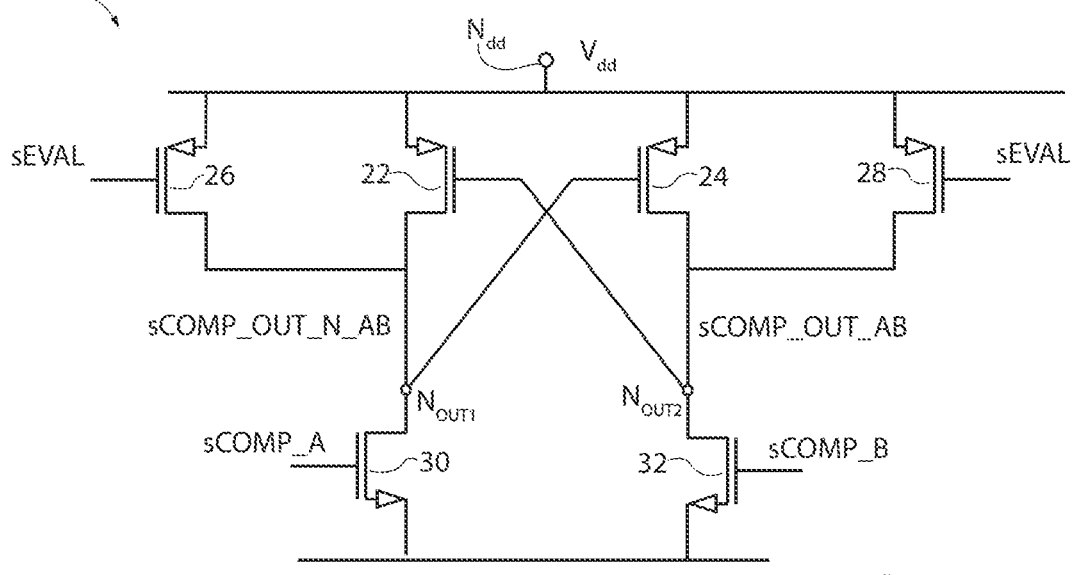
FIG. 4 shows a circuit diagram of a comparison circuit of the sense amplifier architecture.

With reference to FIG. 4, a comparison circuit, denoted with 20, of the comparison stage 12 of the sense amplifier architecture 10 is now disclosed in more details.

As discussed above, the comparison stage 12 includes a number of these comparison circuits 20, each one configured to implement a respective comparisons between signals indicative of the cell currents $I_{cell}$ flowing through respective different memory cells 3 of the non-volatile memory device 1 (e.g., pairwise comparison between respective pairs of memory cells 3).

In the example shown in FIG. 4, the comparison circuit 20 is configured to perform a comparison between output signals sCOMP_A and sCOMP_B, respectively associated with a cell current $I_{cell}$ flowing through a first and a second memory cell, Cell_A and Cell_B (the same output signals sCOMP_A and sCOMP_B being provided by two different sense amplifier reading branches 15 of the reading stage 11 of the sense amplifier architecture 10).

The comparison circuit 20 comprises a first cross-coupled transistor 22 and a second cross-coupled transistor 24 and a first enable transistor 26 and a second enable transistor 28, which are P-channel enhancement-mode transistors and have, for example, similar characteristics.

The source terminals of the first and second cross-coupled transistors 22, 24 and of the first and the second enable transistors 26, 28 are connected to the supply node $N_{dd}$, and are therefore set at the supply voltage $V_{dd}$. The gate terminals of the first and second cross-coupled transistors 22, 24 are connected, respectively, to the drain terminal of the second cross-coupled transistor 24 and to the drain terminal of the first cross-coupled transistor 22.

The drain terminals of the first and second enable transistors 26, 28 form, respectively, a first output node $N_{out1}$ and a second output node $N_{out2}$ of the comparison circuit 20 and are connected, respectively, to the drain terminal of the first and of the second cross-coupled transistors 22, 24. Moreover, a signal sEVAL, equal to the logical negation of the above referenced signal sEVAL_N, is provided on the gate terminals of both the first and the second enable transistors 26, 28.

The comparison circuit 20 further comprises a first output transistor 30 and a second output transistor 32, which are N-channel enhancement-mode transistors and have, for example, similar characteristics.

The drain and source terminals of the first output transistor 30 are connected, respectively, to the first output node $N_{out1}$ and to the reference potential (ground GND). The drain and source terminals of the second output transistor 32 are connected, respectively, to the second output node $N_{out2}$ and to the reference potential. Moreover, the gate terminals of the first and of the second output transistors 30, 32 are connected to the output node $N_{out}$ of a respective sense amplifier reading branch 15, therefore receiving, in this example, the output signal sCOMP_A and, respectively, sCOMP_B.

The voltages present on the first output node $N_{out1}$ and on the second output node $N_{out2}$ are referred to as the signal sCOMP_OUT_N_AB and, respectively, the signal sCOMP_OUT_AB. Moreover, the pairs of logic values (sCOMP_A,sCOMP_B) and (sCOMP_OUT_AB, sCOMP_OUT_N_AB) are referred to, respectively, as the input state and the output state of the comparison circuit 20.

Figure 5:
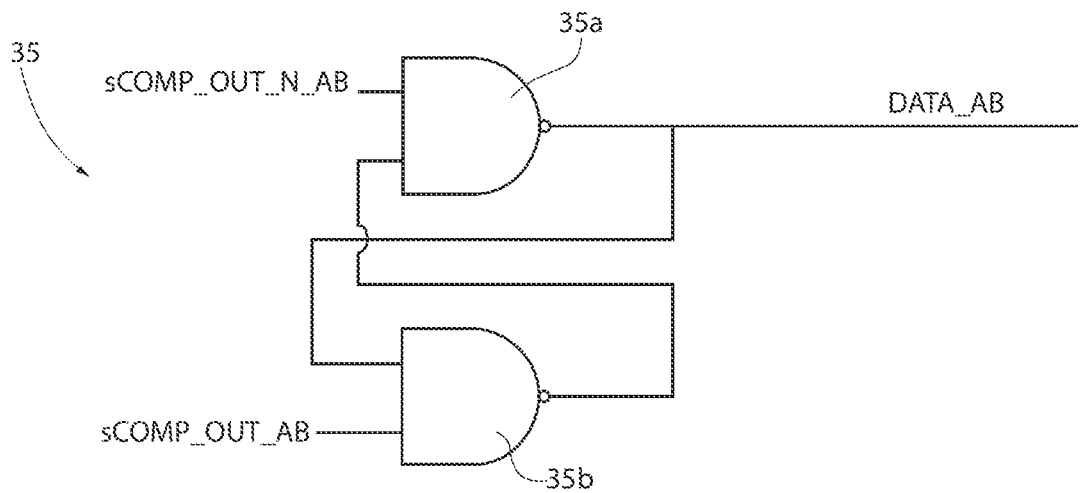
FIG. 5 shows a circuit diagram of a latch circuit of the sense amplifier architecture.

As illustrated in FIG. 5, the comparison stage 12 of the sense amplifier architecture 10 further comprises a respective latch circuit 35 for each of the above-discussed comparison circuits 20.

The latch circuit 35 comprises two NAND gates 35a, 35b, having a respective first input connected to the first and, respectively, the second output nodes $N_{out1}$, $N_{out2}$ of the corresponding comparison circuit 20, so as to receive, respectively, the signal sCOMP_OUT_N_AB and the signal sCOMP_OUT_AB (in the example, referred to the comparison between Cell_A and Cell_B). The second input of each NAND gate 35a, 35b is connected to the output of the other NAND gate 35b, 35a.

The output of NAND gate 35a moreover constitutes here the output of the latch circuit 35, which provides a read data DATA_AB, which has a low or a high value (in the range [0 Vdd]), as a function of the comparison between the cell currents $I_{cell}$, in the example of Cell_A and Cell_B.

According to the above, the sense amplifier architecture 10 allows performing a comparison between the states in which any given couple of memory cells 3 are in, and correspondingly a comparison between the respective cell currents $I_{cell}$. In particular, comparison between the output signals provided by the respective sense amplifier reading branches 15 (for example, sCOMP_A and sCOMP_B) determines the pairs of logic values (e.g., sCOMP_A, sCOMP_B and sCOMP_OUT_AB, sCOMP_OUT_N_AB) at the input and at the output of the corresponding comparison circuit 20 and thus the read data DATA_AB resulting from the comparison and provided at the output of the latch circuit 35.

The logic stage 13 is then configured to process the read data associated with a group of a determined number of non-volatile memory cells 3 and thereby determine the corresponding stored codeword.

Figure 6:
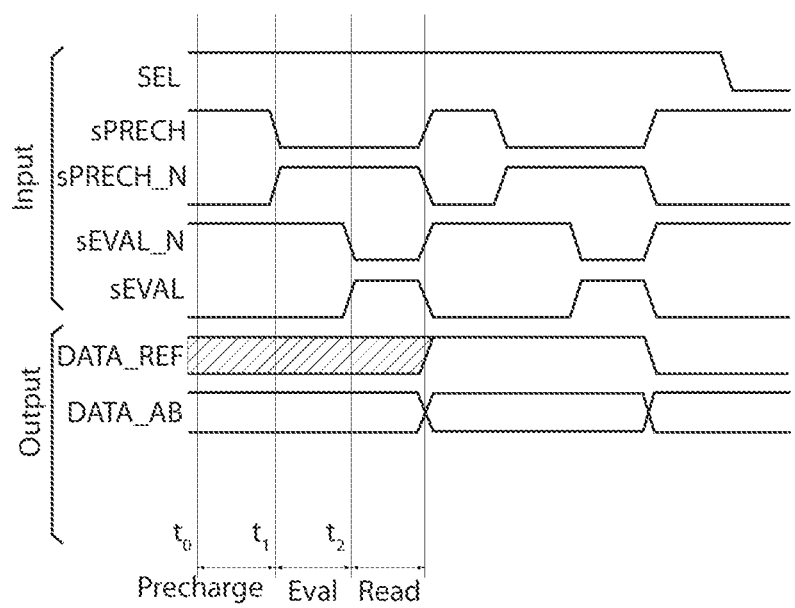
FIG. 6 shows timing diagrams of operation performed in the sense amplifier architecture.

Operation of the sense amplifier reading branch 15 and of the corresponding comparison circuit 20 is now discussed in more details, also referring to the time diagram of FIG. 6.

It is assumed that the first-level decoding and second-level decoding bias signals YO, YM are equal to '1' and are therefore equal to a voltage value such that the first-level decoding transistor TYO and the second-level decoding transistors TYM are in a condition of saturation. For instance, the voltages of the first-level and second-level decoding bias signals YO, YM are comprised in a range between 1.2 and 1.4 V, and are therefore higher than the supply voltage $V_{dd}$. Furthermore, it is assumed, once again by way of example, that a voltage of 0.6 V is present on the local bitline LBL. In addition, it is assumed that a signal SEL that enables the access element 3b, i.e., that allows selection of the memory cell 3a, is present on the gate terminal of the access element 3b.

It is also assumed that the reference voltage $V_{refp\_sa}$ is such that, when the precharge transistor TPRECH is inhibited, the bias transistor TP operates in saturation and a bias current $I_{pol}$ having a desired value flows therethrough.

Albeit not shown, the reference node $N_{ref}$ and the bias transistor TP may form part of current mirrors that can be controlled, for example by the control logic CL, so as to impose the above value $I_{pol}$. Without this implying any loss of generality, in what follows it is assumed that the reference voltage $V_{refp\_sa}$ is such that the value $I_{pol}$ is approximately equal to 20 µA. In general, the reference voltage $V_{refp\_sa}$ is comprised between ground and the supply voltage $V_{dd}$; e.g., the relation $0.1V < V_{refp\_sa} < (V_{dd}-0.3V)$ applies.

Initially, the sense amplifier reading branch 15 is controlled, e.g., by the control logic CL, so as to carry out a precharging step.

In particular, at an instant t0 (see FIG. 6), the signal sEVAL is low (equal to '0,' e.g., has a null voltage), whereas the signal sPRECH is high ('1,' e.g., is equal to the supply voltage $V_{dd}$). Moreover, the signal sPRECH_N is '0'; therefore, the precharge transistor TPRECH operates in linear region and a precharge current $I_{prech}$ passes therethrough. The precharge current $I_{prech}$ is, for example, of the order of 100 µA and is in any case higher than the value $I_{pol}$.

A current $I_i$, which is equal to the sum of the bias current $I_{pol}$ and the precharge current $I_{prech}$, is therefore injected into the input node $N_{in}$.

At the same instant $t_0$, the upper control transistor TC is inhibited and also the lower control transistors TC' is inhibited.

All the current $I_i$ flows in the memory cell 3a and charges a capacitance formed by the main bitline MBL. In practice, the main bitline MBL, which is associated with a capacitance that is much higher than those associated with the local bitlines, is charged.

In addition, at the instant $t_0$, the signal sEVAL_N is equal to '1,' and therefore the evaluation transistor TE operates in linear region, and consequently discharges, i.e., forces to ground, the output node $N_{out}$. Consequently, the signal sCOMP_A (and analogously the signal sCOMP_B of the corresponding sense amplifier reading branch 15) is equal to '0'; this means that the sense transistor TS is off.

The output transistors 30, 32 of the comparison circuit 30 are also inhibited.

Moreover, since sEVAL is equal to '0,' the first and the second enable transistors 26, 28 are above the threshold and force the logic values of the signals sCOMP_OUT_AB and sCOMP_OUT_N_AB to '1.' Consequently, the first and the second cross-coupled transistors 22, 24 are below the threshold.

It is noted that in this step the latch circuit 35 operates in a condition of storage; i.e., the read data DATA_AB maintains the last value assumed.

At a subsequent instant $t_1$, the signals sPRECH and sPRECH_N switch their values, causing the precharging step to end and an evaluation step to start.

In particular, the signal sPRECH_N goes to '1,' and this leads to switching-off of the precharge transistor TPRECH, and therefore also of the corresponding precharge current $I_{prech}$. Instead, the signals sEVAL and sEVAL_N remain, respectively, equal to '0' and to '1.' Consequently, the output node $N_{out}$r remains at ground, and therefore the signals sCOMP_A remains equal to '0,' while the signals sCOMP_OUT_AB and sCOMP_OUT_N_AB remain equal to '1.'

The fact that, at the instant $t_1$, the signal sPRECH becomes equal to '0' means that the upper control transistor TC switches on and starts to operate in saturation; also the lower control transistor TC' switches on and starts to operate in saturation.

In the abovementioned conditions, the cell currents $I_{cell}$ that flows in the memory cells (Cell_A and Cell_B) depend on the values of resistance of the respective storage elements 3a, and therefore upon the data stored.

In particular, a branch current $I_{branch}$ equal to $I_{pol}-I_{cell}$ now flows through the upper control transistor TC and the lower control transistor TC' towards the sense transistor TS.

At a subsequent instant $t_2$, the signals sEVAL and sEVAL_N switch their value, causing the evaluation step to end and a reading step to start.

In particular, at the instant $t_2$, the signal sEVAL_N becomes '0,' and this leads to switching-off of the evaluation transistor TE, which was keeping at ground the output node $N_{out}$r, the voltage (i.e., the signals sCOMP_A and sCOMP_B) of which therefore becomes free to vary.

Therefore, the signals sCOMP_A and sCOMP_B (corresponding to the gate to source voltage of the sense transistor TS) start rising from the initial zero value, with a speed and timing that is dependent on the value of the cell current $I_{cell}$ (in particular as a function of the above branch current $I_{branch}$).

For example, in case Cell_A stores a '1' logic value and Cell_B stores a '0' logic value, the voltage signal sCOMP_B will increase more rapidly than voltage signals sCOMP_A (since the branch current $I_{branch}$ will be higher for Cell_B).

Moreover, since the signal sEVAL has assumed the value '1,' the first and the second enable transistors 26, 28 of the comparison circuit 20 drop below the threshold, thus letting the output nodes $N_{out1}$, $N_{out2}$ to be free to evolve, in particular based on the value of the signals sCOMP_A and sCOMP_B at the gates of the first and second output transistors 30, 32.

The fastest of signals sCOMP_A and sCOMP_B provides the flip direction to the comparison circuit 30, that the following latch circuit 35 then defines in the [GND Vdd] range, providing the read data DATA_AB (which, in the example, will have a low value, '0').

Figure 7:
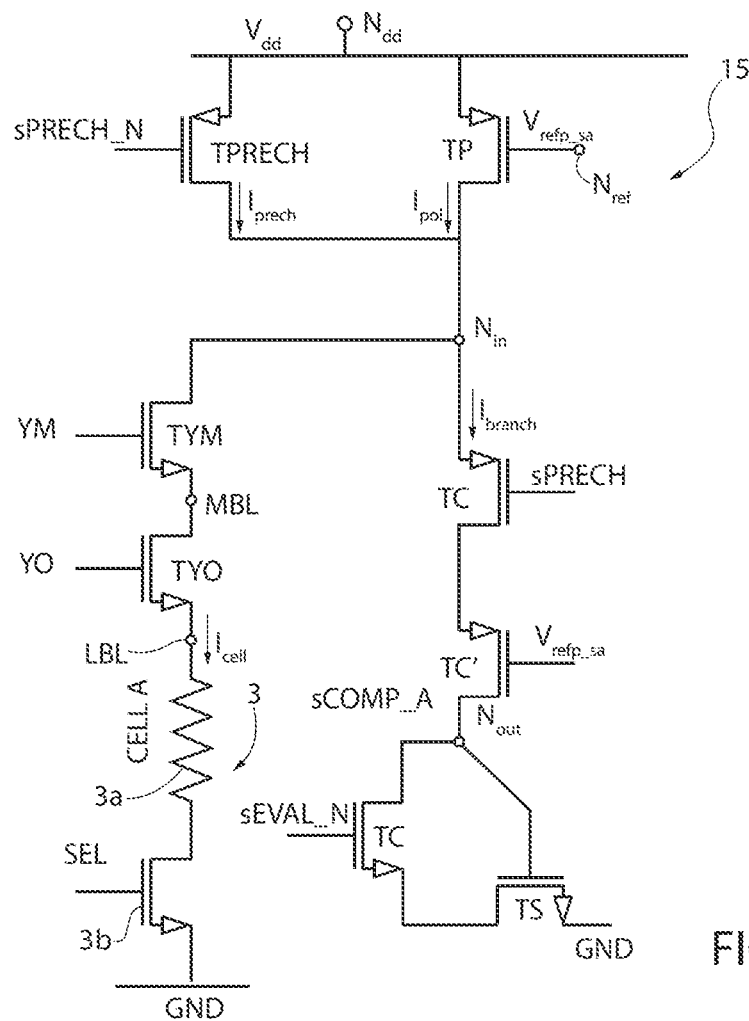
FIG. 7 shows a circuit diagram of a sense amplifier reading circuit of the sense amplifier architecture, according to a different embodiment.

FIG. 7 shows a possible variant embodiment for the sense amplifier reading branch 15, which differs from what discussed with reference to FIG. 3 for a different configuration of the sense transistor TS, which is again of a NMOS type, but here is not diode-connected.

In this case, the gate terminal of the sense transistor TS is connected to the output node $N_{out}$r and the source and drain terminals are connected to the reference potential (ground, GND), as is the source terminal of the evaluation transistor TE.

It is noted that a sense capacitive element could be connected between the output node $N_{out}$r and the reference potential (GND), instead of the sense transistor TS.

In this embodiment, the branch current $I_{branch}$ (equal to $I_{pol}-I_{cell}$) therefore charges a capacitive node (i.e., the gate terminal of the sense transistor TS), thus causing the increase of the output signal (in this case, sCOMP_A) at the output node $N_{out}$r, again with a speed that is a function of the value of the same branch current $I_{branch}$ but in this case with no saturation at a value defined by the gate-source voltage of the same sense transistor TS.

Another difference of this embodiment relates to the configuration of the latch circuit 35 for each of the comparison circuits 20 (which comparison circuits 20 instead do not differ with respect to what has been discussed above).

Figure 8:
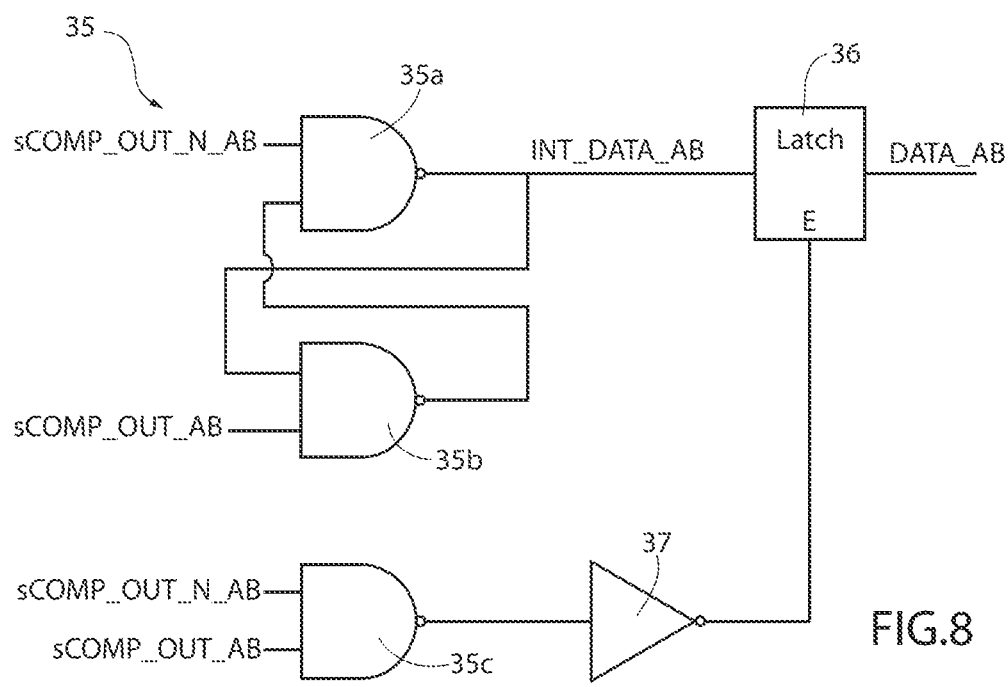
FIG. 8 shows a circuit diagram of a latch circuit of the sense amplifier architecture, according to a different embodiment.

As shown in FIG. 8, the latch circuit 35 here further comprises an output latch 36, which provides at a latching output the read data (e.g., DATA_AB in case of a comparison between memory cells Cell_A and Cell_B) and has a latching input coupled to the output of NAND gate 35a; the output latch 36 moreover has an enable input, which receives an enabling signal E defining a read window timing for latching of the read data DATA_AB.

The latch circuit 35 comprises a further NAND gate 35c receiving at its input both signals sCOMP_OUT_AB and sCOMP_OUT_N_AB and providing, though a buffer 37, the above enabling signal E for the output latch 36.

The read window timing is therefore defined by the evolution of signals sCOMP_OUT_AB and sCOMP_OUT_N_AB (at the output nodes $N_{out1}$, $N_{out2}$ of the comparison circuit 20), which are both high when the reading step starts and evolve to low; once the enabling signal E is high, reading is concluded and the read data DATA_AB is latched by the output latch 36.

A further aspect of the present solution is now discussed, regarding a possible coding of the stored data in the memory array (and a corresponding configuration of the logic stage 13).

According to this coding, given a set of codewords obtainable by the stored values of a determined number $N_c$ of non-volatile memory cells in a group, information can be stored in at least two subsets of this set of codewords comprising each at least a codeword, each codeword in a same subset having a same Hamming weight and each codeword belonging to one subset having a Hamming distance equal or greater than two with respect to each codeword belonging to another subset.

For instance, the number $N_c$ of memory cells 3 in a group can be three, as shown in the Table 1 below. With three cells (Cell_A, Cell_B, Cell_C) and two subsets (SB1, SB2), four codewords can be defined: {000, 011, 101, 110}; thus, four symbols (or bit maps) can be obtained for coding of the stored data.

TABLE 1

| Cell_A | Cell_B | Cell_C | Subset | Symbol | Bit map |
|--------|--------|--------|--------|--------|---------|
| 1      | 1      | 0      | SB1    | 0      | 00      |
| 1      | 0      | 1      | SB1    | 1      | 01      |

TABLE 1-continued

| Cell_A | Cell_B | Cell_C | Subset | Symbol | Bit map |
|--------|--------|--------|--------|--------|---------|
| 0 | 1 | 1 | SB1 | 2 | 10 |
| 0 | 0 | 0 | SB2 | 3 | 11 |

In another example, the number $N_c$ can be four as shown in Table 2 below. With four cells (Cell_A, Cell_B, Cell_C, Cell_D) and two subsets (SB1, SB2), eight codewords can be defined and eight symbols for coding of the stored data.

TABLE 2

| Cell_A | Cell_B | Cell_C | Cell_D | Subset | Symbol | Bit map |
|--------|--------|--------|--------|--------|--------|---------|
| 1 | 0 | 0 | 0 | SB1 | 0 | 000 |
| 0 | 1 | 0 | 0 | SB1 | 1 | 001 |
| 0 | 0 | 1 | 0 | SB1 | 2 | 010 |
| 0 | 0 | 0 | 1 | SB1 | 3 | 011 |
| 0 | 1 | 1 | 1 | SB2 | 4 | 100 |
| 1 | 0 | 1 | 1 | SB2 | 5 | 101 |
| 1 | 1 | 0 | 1 | SB2 | 6 | 110 |
| 1 | 1 | 1 | 0 | SB2 | 7 | 111 |

In this embodiment, when reading (or decoding) the data stored in the coded manner, the subset the data belongs to is determined first.

The reading stage 11 of the sense amplifier architecture 10 therefore further comprises a subset definition circuit 40 (for each group of memory cells 3 defining a codeword), configured to allow determination of the subset to which a codeword to be read belongs to.

This subset definition circuit 40 is implemented as a comparator, configured to compare a signal indicative of the sum of the cell currents $I_{cell}$ of all the memory cells 3 in the group (defining the codeword to be read) with at least a threshold signal, indicative of a reference or fixed current $I_{ref}$, whose suitable value allows a correct discrimination between the subsets.

As previously discussed, the sum actually implemented is between each branch current $I_{branch}$, i.e., the cell current $I_{cell}$ referred to the bias current $I_{pol}$, i.e.: $(I_{pol}-I_{cellA})+(I_{pol}-I_{cellB})+(I_{pol}-I_{cellC})$. Analogously, the threshold signal is referred to the same bias current $I_{pol}$ (actually, to three times the same bias current $I_{pol}$), in order to implement the correct comparison and the subset discrimination.

In the example of Table 1, in which a codeword is defined by three memory cells, codewords in the first subset have two memory cells in the 'SET' (or '1') state and one in the 'RESET' (or '0') state, while codewords in the second subset have no memory cell in the 'SET' state and three in the 'RESET' state. In this example, the threshold signal may be indicative of a reference or fixed current $I_{ref}$ whose value corresponds to that of a single reference memory cell in the 'SET' state: $I_{ref}=I_{ref\_SET}$.

For example, current $I_{ref}$ can be obtained as an average of the current of a certain number of non-volatile memory cells 3 programmed in the same state (in this case, the SET state); alternatively, the current $I_{ref}$ can be obtained from a chosen typical cell in the SET state or from another fixed current of a suitable value.

Figure 9A:
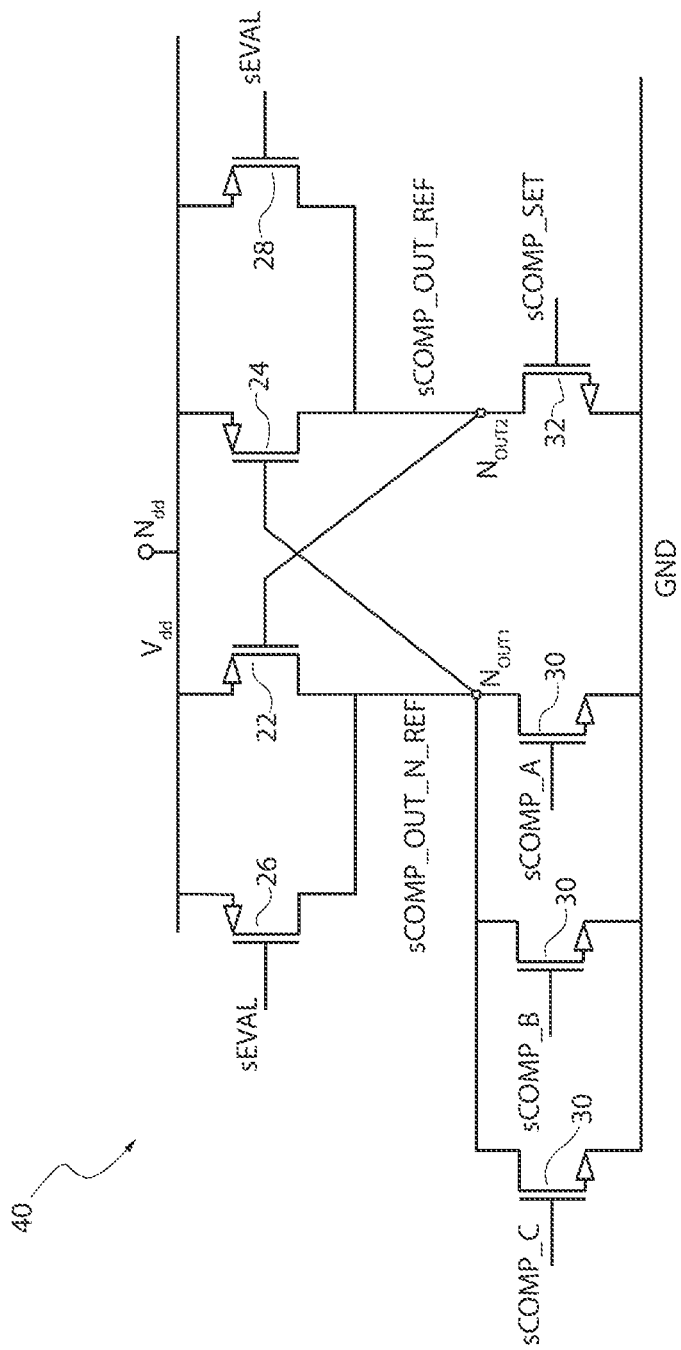
FIGS. 9A and 9B show circuit diagrams of a subset definition circuit in the sense amplifier architecture, according to respective embodiments.

In more details, and as shown in FIG. 9A, the subset definition circuit 40 in this case comprises, analogously to the comparison circuits 20 discussed above: a first cross-coupled transistor, again denoted with 22, and a second cross-coupled transistor 24 and a first enable transistor 26 and a second enable transistor 28, of a P-channel enhancement-mode.

The source terminals of the first and second cross-coupled transistors 22, 24 and of the first and the second enable transistors 26, 28 are connected to the supply node $N_{dd}$, and are therefore set at the supply voltage $V_{dd}$. The gate terminals of the first and second cross-coupled transistors 22, 24 are connected, respectively, to the drain terminal of the second cross-coupled transistor 24 and to the drain terminal of the first cross-coupled transistor 22.

The drain terminals of the first and second enable transistors 26, 28 form, respectively, a first output node $N_{out1}$ and a second output node $N_{out2}$ and are connected, respectively, to the drain terminals of the first and of the second cross-coupled transistors 22, 24. Moreover, a signal sEVAL, equal to the logical negation of the above referenced signal sEVAL_N, is provided on the gate terminals of the first and the second enable transistors 26, 28.

The subset definition circuit 40 further comprises a number $N_c$ of first output transistors 30 (corresponding to the number of memory cells 3 in the codeword), coupled in parallel, between the first output node $N_{out1}$ and the reference potential (GND), receiving at a respective gate terminal the output signal (in the example, sCOMP_A, sCOMP_B, sCOMP_C) provided by a respective sense amplifier reading branch 15 of the sense amplifier architecture 10.

The subset definition circuit 40 moreover comprises, in this example (which is referred to the coding of Table 1), a single second output transistor 32, which is a N-channel enhancement-mode transistor, connected between the second output node $N_{out2}$ and the reference potential (GND) and receiving at a gate terminal a comparison signal sCOMP_SET indicative of the reference or fixed current $I_{ref}$ (whose value corresponds in this case to $I_{ref\_SET}$).

At the first and at the second output nodes $N_{out1}$, $N_{out2}$, a respective output signal sCOMP_OUT_N_REF and sCOMP_OUT_REF is present, indicative of the determined subset. In the example, the signal sCOMP_OUT_REF is '0' for subset SB1 and signal sCOMP_OUT_N_REF is '0' for subset SB2.

The reading stage 11 of the sense amplifier architecture 10 further comprises a respective latch circuit for each of the above-discussed subset definition circuit 40.

The latch circuit (in a corresponding manner as the circuit shown in FIG. 5) comprises two NAND gates, having a respective first input connected to the first and, respectively, the second output nodes of the corresponding subset definition circuit 40, so as to receive, respectively, the signal sCOMP_OUT_N_REF and the signal sCOMP_OUT_REF. The second input of each NAND gate is connected to the output of the other NAND gate.

The output of NAND gate moreover constitutes here the output of the latch circuit, which provides a subset data DATA_REF, which has a low or a high value, indicative of the determined subset. In the example, DATA_REF is '0' for subset SB1 and '1' for subset SB2.

Figure 9B:
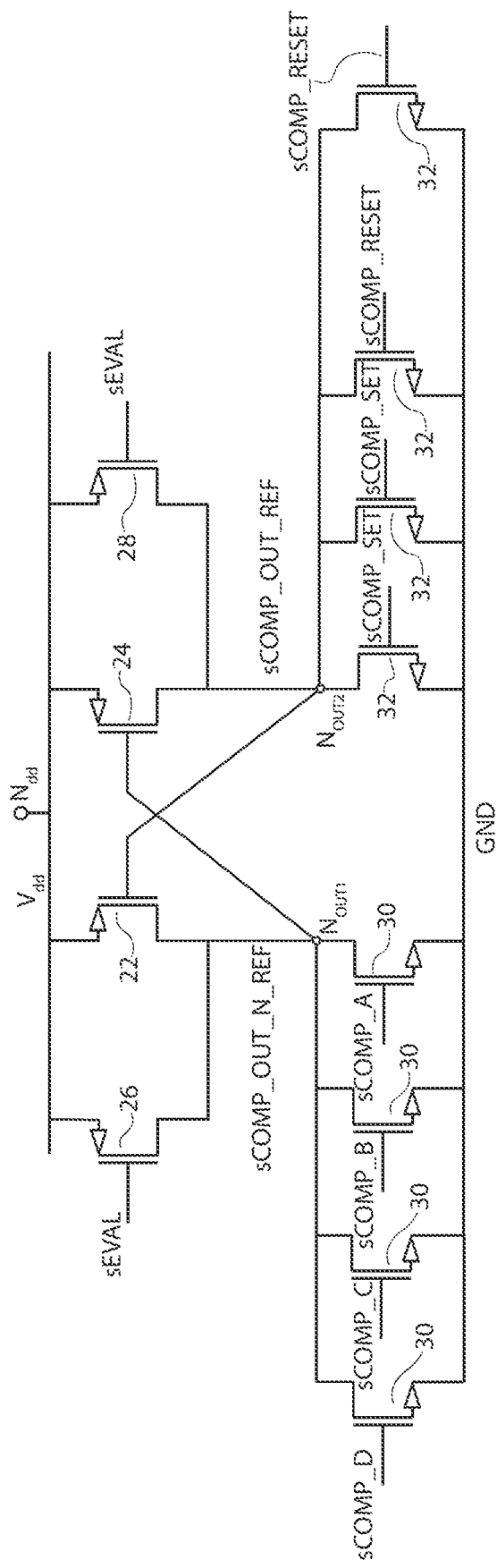

In case the encoding of Table 2 is implemented, as shown in FIG. 9B, the subset definition circuit 40 comprises a certain number of second output transistors 32, which are N-channel enhancement-mode transistors, connected between the second output node $N_{out2}$ and the reference potential (GND) and receiving at a gate terminal a respective comparison signal sCOMP_SET or sCOMP_RESET indicative of a respective reference or fixed current $I_{ref}$ (whose value may correspond in this case to either $I_{ref\_SET}$ or $I_{ref\_RESET}$, i.e., a reference or fixed current whose value corresponds to that of a single reference memory cell in the 'RESET' state).

Indeed, in case the codeword is defined by four memory cells, codewords in the first subset SB1 have one memory cell in the 'SET' state and three memory cells in the 'RESET' state; while codewords in the second subset SB2 have three memory cells in the 'SET' state and one in the 'RESET' state.

In this example, the threshold signal may thus be indicative of a reference or fixed current $I_{ref}$ whose value corresponds to any suitable combination of reference memory cells in the 'SET' or 'RESET' state, for example: $I_{ref} = 2 \cdot I_{ref\_SET} + 2 \cdot I_{ref\_SET}$.

Also in this example, the signal sCOMP_OUT_REF is '0' for subset SB1 and signal sCOMP_OUT_N_REF is '0' for subset SB2.

Figure 10:
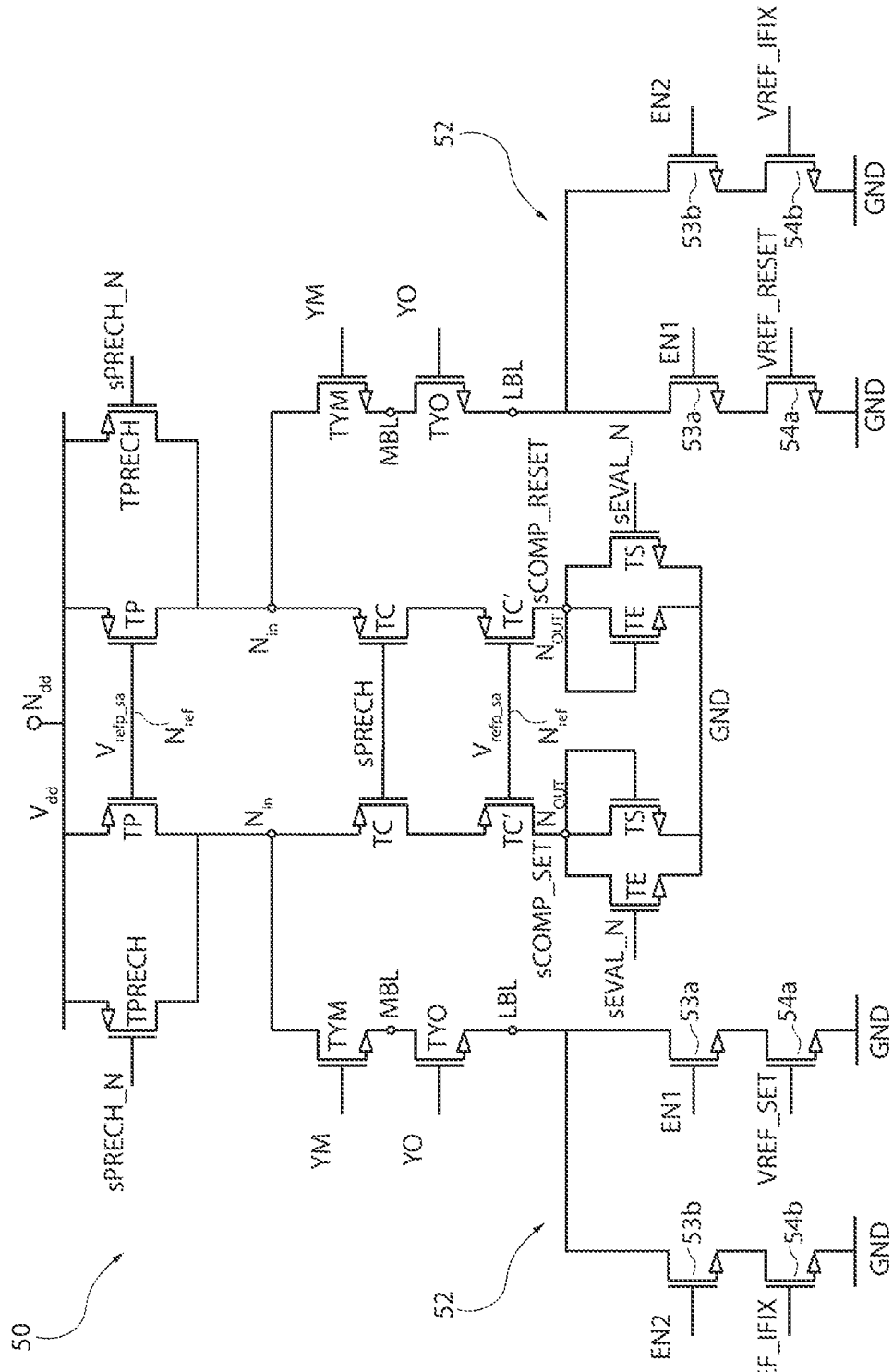
FIG. 10 shows a circuit diagrams of a reference generation circuit in the sense amplifier architecture.

FIG. 10 shows a possible implementation of a reference generation circuit 50 in the sense amplifier architecture 10, configured to generate the above signals sCOMP_SET and, respectively, sCOMP_RESET for the subset definition circuit 40.

This circuit largely corresponds to a sense amplifier reading branch 15 of the reading stage 11 of the sense amplifier architecture 10 (shown in FIG. 3), so that similar elements will be denoted with the same reference numbers and will not be discussed again in detail.

Differently from the sense amplifier reading branch 15, in this reference generation circuit 50 the local bit line (in this case being "dummy," not being connected to a memory cell) is coupled to a reference generator 52 configured to generate the reference or fixed current $I_{ref}$.

The reference generator 52 comprises a first enabling transistor 53a and a first reference transistor 54a, both of the NMOS type, connected in series between the (dummy) local bit line LBL and the reference potential (GND), the first enabling transistor 53a having a gate terminal receiving a first enabling signal EN1 and the first reference transistor 54a having a gate terminal receiving a first reference voltage VREF_SET (or VREF_RESET), being indicative of the current $I_{ref\_SET}$ of a reference memory cell in the 'SET' state (or analogously of the current $I_{ref\_RESET}$ of a reference memory cell in the 'RESET' state).

The reference generator 52 further comprises a second enabling transistor 53b and a second reference transistor 54b, both of the NMOS type, connected in series between the (dummy) local bit line LBL and the reference potential (GND), the second enabling transistor 53b having a gate terminal receiving a second enabling signal EN2 and the second reference transistor 54b having a gate terminal receiving a second reference voltage VREF_IFIX, being indicative of a fixed value for the current $I_{ref\_SET}$ or $I_{ref\_RESET}$, simulating the current circulating in a memory cell 3 in the SET or RESET state.

Depending on the values of the first and second enabling signals EN1, EN2, the reference generation circuit 50 thus generates the above signals sCOMP_SET, sCOMP_RESET, being indicative of a reference or fixed current $I_{ref}$ (whose value corresponds to $I_{ref\_SET}$, respectively to $I_{ref\_RESET}$).

An exemplary disclosure is now provided concerning operation of the logic stage 13 of the sense amplifier architecture 10, configured to process the read data associated with a group of non-volatile memory cells 3 and thereby determine the corresponding stored codeword (as previously discussed, a majority logic may be implemented to identify the stored codeword).

Reference is first made to the exemplary coding of the above Table 1, assuming, as an example, that a codeword [0 1 1] has been stored, with Cell_A='0,' Cell_B='1' and Cell_C='1.'

The following table, Table 3, summarizes the results expected at the output of the comparison circuits 20 (considering that DATA_REF is '1':

TABLE 3

| Comparison | Result |
|---|---|
| DATA_AB, A vs B | B win |
| DATA_AC, A vs C | C win |
| DATA_BC, B vs C | B or C either can win, X |

It is noted that cell_A with value '0' loses the three comparisons with the other two cells (Cell_B and Cell_C); the logic stage 13 thus determines that the stored codeword is [0 1 1].

In this example, if DATA_REF is '0,' then the stored codeword is [0 0 0], independently by the comparison results.

Reference is now made to the exemplary coding of the above Table 2, assuming, as an example, that a codeword [0 0 0 1] has been stored, with Cell_A='0,' Cell_B='0,' Cell_C='0' and Cell_D='1.'

Again, a majority logic may be implemented by the logic stage 13 to identify the stored codeword.

The following table, Table 4, summarizes in this case the results expected at the output of the comparison circuits 20 (considering that DATA_REF is '1'):

TABLE 4

| Comparison | Result |
|---|---|
| DATA_AB, A vs B | A or B either can win, X |
| DATA_AC, A vs C | A or C either can win, X |
| DATA_AD, A vs D | D |
| DATA_BC, B vs C | B or C either can win, X |
| DATA_BD, B vs D | D |
| DATA_CD, C vs D | D |

It is noted that cell_D with value 1 wins the three comparisons with the other three memory cells 3; the logic stage 13 thus determines that the stored codeword is [0 0 0 1]; in other words, it is sufficient to identify the position of maximum current, for the codewords in Subset SB1 (it is analogously sufficient to identify the position with minimum current, in case of Subset SB2).

The advantages that the present solution allows to achieve are clear from the foregoing description.

In general, the sense amplifier architecture 10 allows to compare the data stored in any memory cell 3 of the non-volatile memory device 1 with any suitable number of other memory cells 3, so as to decode the codewords used for storing information.

Accordingly, the solution here described allows to achieve a more compact and efficient memory occupation.

Also, the solution here described necessitates less memory cells 3 to compose the array, determining a possible yield improve.

Moreover, the disclosed solution provides similar access time as available solutions, with no timing penalty.

The resulting non-volatile storage device 1 can therefore find use in numerous contexts.

Figure 11:
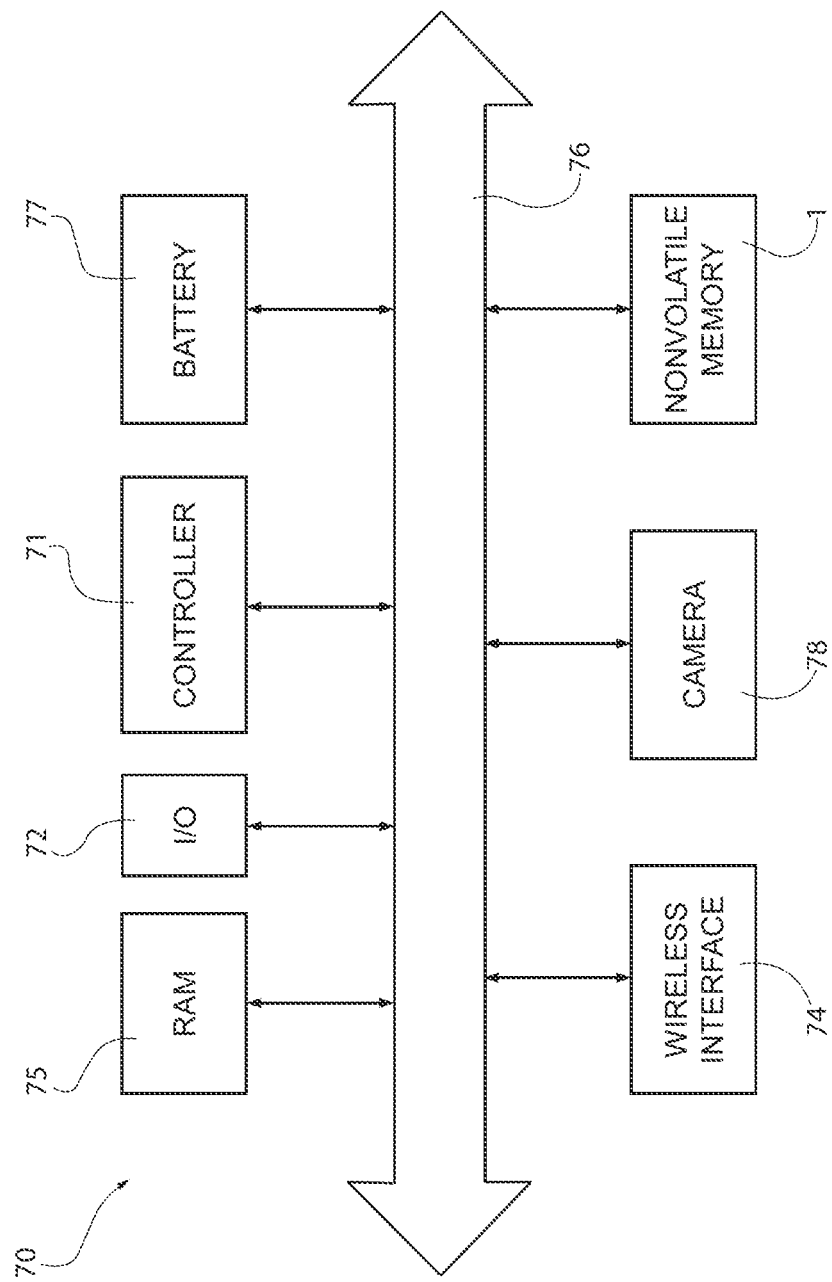
FIG. 11 shows a schematic block diagram of an electronic apparatus that incorporates a memory device that includes the present sense amplifier architecture.

For instance, FIG. 11 illustrates a portion of an electronic apparatus 70, which may, for example, be: a PDA (Personal Digital Assistant); a portable or desktop computer, possibly with capacity of wireless data transfer; a mobile phone; a digital audio player; a camera or a camcorder; or further devices capable of processing, storing, transmitting, and receiving information.

The electronic apparatus 70 comprises: a controller 71 (for example, provided with a microprocessor, a DSP or a microcontroller); an input/output device 72 (for example, provided with a keypad and a display), for input and display of data; the non-volatile storage device 1; a wireless interface 74, for example an antenna, for transmitting and receiving data through a radiofrequency wireless communication network; and a RAM 75. All the components of the electronic apparatus 70 are coupled through a bus 76. A battery 77 can be used as electrical power supply source in the electronic apparatus 70, which may moreover be equipped with a camera, or video camera or camcorder 68. Moreover, the controller 71 can control the non-volatile storage device 1, for example co-operating with the control logic CL.

In addition, it is clear that modifications and variations may be made to what has been described and illustrated herein, without, thereby, departing from the scope of the present disclosure.

For instance, it is again underlined that the present sense amplifier architecture 10 can be used for memory cells 3, which may be different from memory cells of a PCM type, e.g., for ST-RAM or RRAM memory cells.

A sense amplifier architecture (10) for a non-volatile memory device (1) may be summarized as including a plurality of memory cells (3), wherein groups of memory cells store respective codewords formed by stored logic states, logic high ('1') or logic low ('0'), of the memory cells of the group; said sense amplifier architecture (10) including a plurality of sense amplifier reading branches (15), each sense amplifier reading branch (15) coupled to a respective memory cell (3) and configured to provide an output signal (sCOMP_A), which is indicative of a cell current ($I_{cell}$) flowing through the same memory cell (3); a comparison stage (12), configured to perform a comparison between the cell currents ($I_{cell}$) of memory cells (3) of a group; and a logic stage (13), configured to determine, based on comparison results provided by the comparison stage (12), a read codeword corresponding to the group of memory cells (3).

The output signal (sCOMP_A) of the sense amplifier reading branch (15) may be related by an inverse relation to the respective cell current ($I_{cell}$).

The output signal (sCOMP_A) of the sense amplifier reading branch (15) may be a function of a branch current ($I_{branch}$) flowing through the sense amplifier reading branch (15), given by:

$$I_{branch}=I_{pol}-I_{cell},$$

wherein $I_{pol}$ is a bias current provided to the sense amplifier reading branch (15) and $I_{cell}$ is said cell current.

The sense amplifier reading branch (15) may include a bias transistor (TP) coupled between a power supply node ($N_{dd}$) and an input node ($N_{in}$) and having a gate terminal receiving a reference voltage ($V_{refp\_sa}$), so that a bias current ($I_{pol}$) flows therethrough and to the input node; wherein the memory cell (3) may be coupled to the input node ($N_{in}$) via at least a selection transistor (TYM, TYO) enabling selection of the memory cell (3); the sense amplifier reading branch (15) may further include a current sensing element (TS) coupled to the input node ($N_{in}$) and configured to provide the output signal (sCOMP_A) as a function of a branch current ($I_{branch}$), being a difference between the bias current ($I_{pol}$) and the cell current ($I_{cell}$) flowing through the selected memory cell.

The current sensing element (TS) may be a sense transistor, diode-connected between an output node ($N_{out}$) on which the output signal (sCOMP_A) is provided and a reference terminal (GND); wherein the output node ($N_{out}$) is coupled to the input node ($N_{in}$) via a switch element (TC).

The sense amplifier reading branch (15) may further include a forcing transistor (TE) having a drain terminal coupled to an output node ($N_{out}$) on which the output signal (sCOMP_A) is provided, a source terminal coupled to a reference terminal (GND) and a gate terminal receiving an enabling signal (sEVAL_N) such as to, alternatively, couple the output node ($N_{out}$) to the reference terminal (GND) or enable an evolution of the voltage on the output node ($N_{out}$) as a function of the branch current ($I_{branch}$); wherein the current sensing element (TS) is a sense transistor, coupled between the source terminal of the forcing transistor (TE) and the reference terminal (GND) and having a gate terminal coupled to the output node ($N_{out}$); wherein the output node ($N_{out}$) is coupled to the input node via a switch element (TC).

The comparison stage (12) may be configured to perform pairwise comparisons between the output signals (sCOMP_A, SCOMP_B) of the sense amplifier reading branches (15) coupled to respective memory cells (3) of the group, obtaining respective pairwise comparison results, depending on which cell current of the memory cells (3) being compared is higher; wherein the logic stage (13) is configured to determine the read codeword based on the pairwise comparison results.

The logic stage (13) may be configured to determine the read codeword based on a majority logic.

Given a set of codewords obtainable by the stored values in the memory cells (3) in a group, information may be stored in at least two subsets (SB1, SB2) of said set of codewords, may include each at least a codeword, each codeword in a same subset having a same Hamming weight and each codeword belonging to one subset (SB1) having a Hamming distance equal or greater than two with respect to each codeword belonging to another subset (SB2); wherein the sense amplifier architecture (10) may further include a subset definition circuit (40) for each group of memory cells (3), configured to allow determination of the subset to which a codeword to be read belongs.

The logic stage (13) may be configured to determine the read codeword corresponding to the group of memory cells (3) also based on the subset determination by the subset definition circuit (40).

The subset definition circuit (40) may include a comparator circuit, configured to compare a signal indicative of a sum of the cell currents ($I_{cell}$) of all the memory cells (3) in the group with a threshold signal, whose value allows a discrimination between the subsets (SB1, SB2).

The threshold signal may be indicative of a reference or fixed current ($I_{ref}$), being a combination of one or more cell currents in memory cells (3) being in a first logic state and/or of one or more cell currents in memory cells (3) being in a second logic state.

The subset definition circuit (40) may include a first cross-coupled transistor (22) and a second cross-coupled transistor (24) connected between a power supply node ($N_{dd}$) and a first ($N_{out1}$), respectively a second ($N_{out2}$), output and having gate terminals connected, respectively, to the second and first output nodes; a number of first output transistors (30), the number corresponding to the number of memory cells (3) in the codeword, coupled in parallel, between the first output node ($N_{out1}$) and a reference potential (GND), receiving at a respective gate terminal the output signal (sCOMP_A, sCOMP_B, sCOMP_C) provided by a respective sense amplifier reading branch (15); and at least an output transistor (32), coupled between the second output node ($N_{out2}$) and the reference potential (GND) and receiving at a gate terminal a comparison signal (sCOMP_SET, sCOMP_RESET) indicative of the reference or fixed current ($I_{ref}$); wherein, at the first and at the second output nodes ($N_{out1}$, $N_{out2}$) a respective output signal (sCOMP_OUT_N_REF, sCOMP_OUT_REF) is present, indicative of the determined subset.

A memory device (1) may be summarized as including at least a sense amplifier architecture (10) according to any one of the embodiments described above, the memory device (1) may further include said memory cells (3), the memory cells (3) being of the type in which the stored logic state is changed through application of a current and the stored logic state in the memory cell is read by reading a current flowing therethrough.

The memory cells (3) may be PCM—Phase Change Memory—cells.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sense amplifier architecture comprising:
a plurality of sense amplifier reading branches coupled to a non-volatile memory device having a plurality of memory cells,
the plurality of memory cells including a plurality of groups of memory cells that store respective codewords formed by stored logic states,
each of the plurality of sense amplifier reading branches coupled to a respective memory cell of the plurality of memory cells, and configured to provide an output signal indicative of a cell current flowing through the respective memory cell,
each of the plurality of sense amplifier reading branches including:
a sense transistor coupled to an input node and configured to provide the output signal,
a forcing transistor having a drain terminal coupled to an output node on which the output signal is provided, a source terminal coupled to a reference terminal, and a gate terminal configured to receive an enabling signal, and
a switch element that couples the output node to the input node,
the sense transistor coupled between the source terminal of the forcing transistor and the reference terminal, and having a gate terminal coupled to the output node;
a comparison stage configured to perform a comparison between cell currents of memory cells in a group of memory cells of the plurality of groups of memory cells; and
a logic stage configured to determine, based on comparison results provided by the comparison stage, a read codeword corresponding to the group of memory cells.

2. The sense amplifier architecture according to claim 1, wherein the output signal is related by an inverse relation to the cell current.

3. The sense amplifier architecture according to claim 1, wherein the output signal is a function of a branch current that flows through the sense amplifier reading branch that provided the output signal, given by:

$$I_{branch} = I_{pol} - I_{cell},$$

wherein $I_{pol}$ is a bias current provided to the sense amplifier reading branch, and $I_{cell}$ is the cell current.

4. The sense amplifier architecture according to claim 1, wherein each of the plurality of sense amplifier reading branches includes a bias transistor coupled between a power supply node and the input node and having a gate terminal receiving a reference voltage, so that a bias current flows therethrough and to the input node;
wherein the respective memory cell is coupled to the input node via at least a selection transistor configured to enable selection of the respective memory cell;
wherein the sense transistor is configured to provide the output signal as a function of a branch current being a difference between the bias current and the cell current.

5. The sense amplifier architecture according to claim 4, wherein the sense transistor is diode-connected between the output node and the reference terminal.

6. The sense amplifier architecture according to claim 4, wherein
the gate terminal is configured to receive the enabling signal such as to, alternatively, couple the output node to the reference terminal or enable an evolution of voltage on the output node as a function of the branch current.

7. The sense amplifier architecture according to claim 1, wherein the comparison stage is configured to perform pairwise comparisons between output signals of sense amplifier reading branches coupled to respective memory cells of the group of memory cells, obtaining respective pairwise comparison results, depending on which cell current of memory cells being compared is higher;
wherein the logic stage is configured to determine the read codeword based on the pairwise comparison results.

8. The sense amplifier architecture according to claim 7, wherein the logic stage is configured to determine the read codeword based on a majority logic.

9. The sense amplifier architecture according to claim 1, wherein, given a set of codewords obtainable by stored values in the memory cells in the group of memory cells, information is stored in at least two subsets of the set of codewords, each codeword in a same subset having a same Hamming weight, each codeword belonging to one subset having a Hamming distance equal or greater than two with respect to each codeword belonging to another subset;
wherein the sense amplifier architecture further includes a subset definition circuit for each of the groups of memory cells, the subset definition circuit configured to allow determination of a subset to which a codeword to be read belongs to.

10. The sense amplifier architecture according to claim 9, wherein the logic stage is configured to determine the read codeword corresponding to the group of memory cells based on the determined subset.

11. The sense amplifier architecture according to claim 9, wherein the subset definition circuit includes a comparator circuit configured to compare a signal indicative of a sum of cell currents of the group of memory cells with a threshold signal having a value that allows a discrimination between the at least two subsets.

12. The sense amplifier architecture according to claim 11, wherein the threshold signal is indicative of a reference current being a combination of one or more cell currents in memory cells being in a first logic state or of one or more cell currents in memory cells being in a second logic state.

13. The sense amplifier architecture according to claim 12, wherein the subset definition circuit includes:
  a first cross-coupled transistor connected between a power supply node and a first output node;
  a second cross-coupled transistor connected between the power supply node and a second output node, the first and second cross-coupled transistors having gate terminals connected to the second and first output nodes, respectively;
  a number of first output transistors coupled in parallel between the first output node and a reference potential, and configured to receive, at a respective gate terminal of the number of first output transistors, an output signal provided by a respective sense amplifier reading branch, the number of first output transistors corresponding to a number of memory cells in the codeword; and
  a second output transistor coupled between the second output node and the reference potential, and configured to receive, at a gate terminal of the second output transistor, a comparison signal indicative of the reference current;
  wherein, at the first and second output nodes, respective output signals are present, indicative of the determined subset.

14. A memory device comprising:
  a plurality of memory cells including a plurality of groups of memory cells that store respective codewords formed by stored logic states, the stored logic states configured to change through application of currents on the plurality of memory cells and configured to be read by reading currents flowing through the plurality of memory cells; and
  a sense amplifier architecture including:
    a plurality of sense amplifier reading branches coupled to the plurality of memory cells, each of the plurality of sense amplifier reading branches coupled to a respective memory cell of the plurality of memory cells, and configured to provide an output signal indicative of a cell current flowing through the respective memory cell;
    a comparison stage configured to perform a comparison between cell currents of memory cells in a group of memory cells of the groups of memory cells;
    a logic stage configured to determine, based on comparison results provided by the comparison stage, a read codeword corresponding to the group of memory cells; and
    a subset definition circuit for each of the groups of memory cells, the subset definition circuit configured to allow determination of a subset to which a codeword to be read belongs to,
    given a set of codewords obtainable by stored values in the memory cells in the group of memory cells, information is stored in at least two subsets of the set of codewords, each codeword in a same subset having a same Hamming weight, each codeword belonging to one subset having a Hamming distance equal or greater than two with respect to each codeword belonging to another subset.

15. The memory device according to claim 14, wherein the plurality of memory cells are Phase Change Memory (PCM) cells.

16. The memory device according to claim 14, wherein the output signal is related by an inverse relation to the cell current.

17. The memory device according to claim 14,
  wherein the comparison stage is configured to perform pairwise comparisons between output signals of sense amplifier reading branches coupled to respective memory cells of the group of memory cells, obtaining respective pairwise comparison results, depending on which cell current of memory cells being compared is higher;
  wherein the logic stage is configured to determine the read codeword based on the pairwise comparison results.

18. A device, comprising:
  a plurality of memory cells having a plurality of groups of memory cells, each of the plurality of groups of memory cells configured to store a codeword;
  a plurality of sense amplifier reading circuits coupled to the plurality of memory cells, the plurality of sense amplifier reading circuits configured to generate a plurality of output signals indicative of cell currents flowing through the plurality of memory cells, each of the plurality of sense amplifier reading branches including:
    a sense transistor coupled to an input node and configured to provide an output signal of plurality of output signals, the sense transistor having a drain terminal, a source terminal coupled to a reference terminal, and a gate terminal coupled to an output node on which the output signal is provided,
    a forcing transistor coupled between the output node and the drain terminal of the sense transistor, and having a gate terminal configured to receive an enabling signal, and
    a switch element that couples the output node to the input node;
  comparison circuitry configured to compare cell currents of memory cells in a group of memory cells of the groups of memory cells; and
  logic circuitry configured to determine a codeword stored in the group of memory cells based on the comparison by the comparison circuitry.

19. The device according to claim 18, wherein the plurality of output signals are inversely related to the cell currents.

20. The device according to claim 18,
  wherein the comparison circuitry is configured to perform pairwise comparisons between the plurality of output signals of sense amplifier reading branches coupled to the group of memory cells;
  wherein the logic circuitry is configured to determine the codeword stored in the group of memory cells based on the pairwise comparison.

* * * * *